United States Patent [19]
Mok

[11] Patent Number: 5,822,017
[45] Date of Patent: Oct. 13, 1998

[54] AGC FOR VIDEO SIGNAL COMPRISING FUSIBLE LINKS

[75] Inventor: Do-sang Mok, Seoul, Rep. of Korea

[73] Assignee: Samsung Electronics Co., Ltd., Kyungki-do, Rep. of Korea

[21] Appl. No.: 659,527

[22] Filed: Jun. 5, 1996

Related U.S. Application Data

[63] Continuation-in-part of Ser. No. 451,838, May 30, 1995.

[30] Foreign Application Priority Data

Jun. 5, 1995 [KR] Rep. of Korea .................. 1995-14846

[51] Int. Cl.⁶ ...................................................... H04N 5/52
[52] U.S. Cl. ............................ 348/678; 348/571; 327/525
[58] Field of Search ..................................... 348/678, 679, 348/681, 682, 683, 684, 685, 571; 327/525; 337/4; 340/590, 638; H04N 5/52, 5/53, 5/54, 5/55, 5/56, 5/20

[56] References Cited

U.S. PATENT DOCUMENTS

| | | | |
|---|---|---|---|
| 4,032,949 | 6/1977 | Bierig | 357/51 |
| 4,860,100 | 8/1989 | Rakhodai et al. | 348/678 |
| 4,883,991 | 11/1989 | Kroner et al. | 348/678 |
| 4,884,141 | 11/1989 | Hyakutake | 348/678 |
| 5,272,531 | 12/1993 | McGinn | 358/154 |

*Primary Examiner*—Christopher C. Grant
*Attorney, Agent, or Firm*—Cushman Darby & Cushman IP Group of Pillsbury Madison & Sutro LLP

[57] ABSTRACT

A fusing system is provided in connection with an integrated circuit, which may be mounted within a semiconductor integrated circuit package having a plurality of external pins. The fusing system is provided with a fusing control circuit operable in an adjusting mode and in a fusing mode, which receives a serial data signal and uses that signal in one way when in an adjusting mode and in another way when in a fusing mode. A fusing circuit is provided for fusing selected ones of the fusible links when the fusing control circuit is in the fusing mode. The fusing system may be used as part of an automatic gain control system for automatically controlling the signal strength of a video signal output from a video processing circuit.

15 Claims, 10 Drawing Sheets

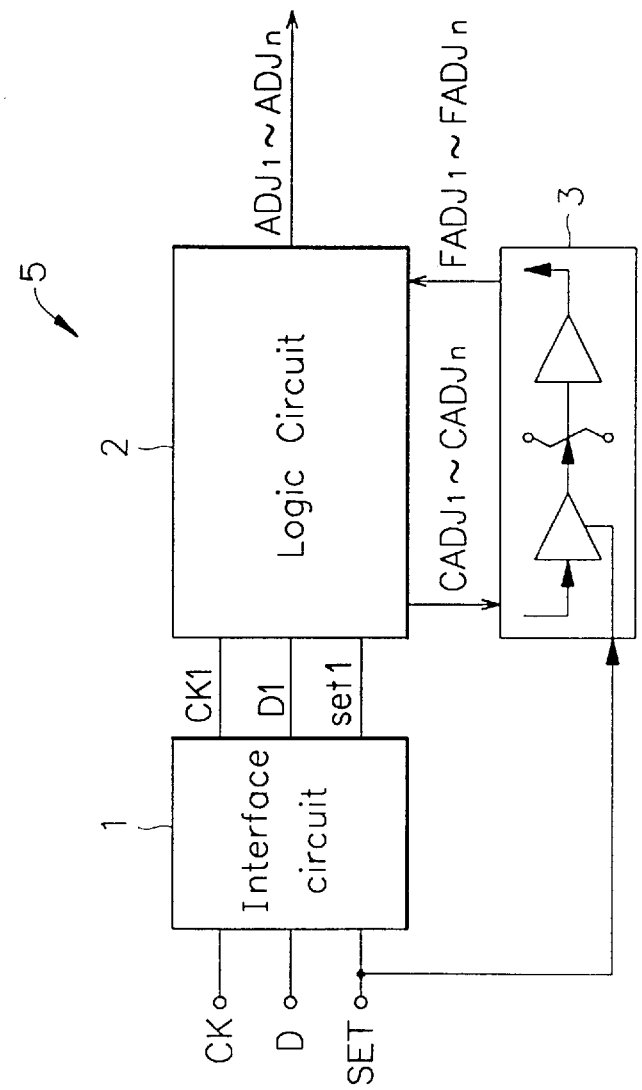

AGC FOR VIDEO SIGNAL COMPRISING FUSIBLE LINKS

RELATED APPLICATION DATA

The present disclosure is a continuation-in-part application of U.S. patent application Ser. No. 08/451,838, filed on May 30, 1995, the content of which is hereby expressly incorporated by reference herein in its entirety.

This disclosure is further related to the disclosures provided in Korean Application No. 94-39687, filed in Korea on Dec. 30, 1994, and to Korean Application No. 95-14846, filed in Korea on Jun. 5, 1995. The content of each of these Korean patent documents is hereby expressly incorporated herein by reference in its entirety.

BACKGROUND OF THE INVENTION

1. Field of the Invention

The present invention relates to a fusing system provided with an integrated circuit. More particularly, the present invention relates to a fusing system capable of selectively fusing fusible links provided in connection with an integrated circuit.

2. Description of Background Information

The process of manufacturing an integrated circuit (IC) can be quite complicated, and the electrical characteristics of the resulting finished ICs having the same functions may fluctuate from one or more of their targeted design values. With some products, it is essential that these targeted design values be attained, and be uniform all the produced ICs.

For example, a video home system (VHS) type video tape recorder (VTR) in the NTSC mode must generate an FM carrier wave having a frequency with respect to a Sync Tip designated as 3.4±0.1 MHz. In order to achieve this desired FM carrier wave, an IC which forms part of the VTR must be configured so that it has certain electrical values that are maintained as uniform from one IC to the other. However, there are situations where a manufactured IC is unusable because it has electrical characteristics deviating from desired electrical characteristics, even though the manufacture of such an IC has been carefully controlled, designed, and performed.

As another example, a video signal processing circuit IC of a video cassette recorder (VCR) may be provided with an automatic gain control system for adjusting its operations so that it outputs a video signal having a desired luminance output signal level (e.g., 2.0 Vpp) upon receiving an input video signal with a certain luminance input signal level (e.g., 1.0 Vpp).

In certain contexts, the electrical characteristics of manufactured ICs have been controlled or adjusted in order to achieve desired electrical characteristics by utilizing a fusing system. The fusing system includes fusible links which are selectively broken like a fuse when a relatively high current is applied. By selectively breaking or leaving intact specific fusible links, the IC can be modified/customized in order to achieve the desired electrical characteristics. Such an adjustment may result in adjustment of values such as a resistance value, a current value, or a voltage level within the IC.

There is a need for improved fusing systems which will allow ICs to be tested and adjusted during their manufacture by selectively breaking or leaving intact specific fusible links. In this regard, it has been desired to provide fuse points on the package, i.e., to provide a limited number of pins accessible external to a semiconductor IC package which will facilitate the control of a fusing system. By limiting the number of pins, the size of the package may be decreased.

In certain applications, the electrical characteristics of the IC have not typically been adjusted with the use of fusible links. This holds true for an automatic gain control system provided as part of a video signal processing circuit IC. The AGC may be adjusted in order to accurately and optimally eliminate fluctuation in certain electrical characteristics of that IC. The AGC system detects fluctuations in the strength of a signal (e.g., the signal level in volts), and appropriately adjusts the gain of an amplifier to increase or decrease in response to a corresponding increase or decrease in the detected signal strength. The sensitivity with which the AGC system responds to slight variations in detected signal strength may be initially set.

Conventionally, this setting is performed manually by adjusting a variable resister. Accordingly, the AGC system, once initially set (calibrated), may be used to compensate for fluctuations in the electrical characteristics of a particular IC so that they correspond to targeted design values. However, AGC systems which require manual adjustment of a variable resister (or another manual adjustment system) can result in delays in manufacturing and a corresponding increase in the cost to manufacture the resulting device, such as a VCR.

SUMMARY OF THE INVENTION

An object of the present invention is to provide in a semiconductor IC package an improved fusing system which will allow certain electrical characteristics of the IC to be adjusted by selectively breaking or leaving intact specific fusible links. In order to achieve this end, one or more aspects of this invention may be followed in order to bring about one or more specific objects and advantages such as those noted below.

One object of the present invention is to provide a semiconductor IC package with a fusing system having a fusing circuit and a desired number of fusible links. It is a further object of the present invention to provide an improved and simplified structure for interfacing with the fusing system in order to selectively break or leave intact specific fusible links provided within the fusing circuit. Such an improved interface structure may include a small number of pins external to the semiconductor IC package, which allows the total number of external pins provided on the semiconductor IC package to be minimized or otherwise reduced, thus reducing manufacturing costs.

Another object of the present invention, in another aspect, is to provide an automatic gain control (AGC) system in connection with a semiconductor IC package. The AGC system includes a fusing system having a plurality of fusing elements (fusible links). The fusible links may be selectively broken in order to change the initial setting of the AGC circuit.

To achieve the first object noted above, according to one aspect of the present invention, a fusing system may be provided as part of a semiconductor IC package. The fusing system may receive input control signals via a number of external pins. A fusing control circuit may be provided for detecting the input control signals received by the interface circuit, and a fusing circuit may be provided for selectively fusing fusible links provided as part of the IC in response to a predetermined signal being output by the fusing control circuit.

BRIEF DESCRIPTION OF THE DRAWINGS

The above and other objects, features and advantages of the present invention are further described in the detailed description which follows, with reference to the drawings by way of non-limiting exemplary embodiments of the present invention, wherein like reference numerals represent similar parts of the present invention throughout the several views, and wherein:

FIG. 2 is a block diagram of a fusing system which may be provided in connection with the semiconductor IC package illustrated in FIG. 1;

DETAILED DESCRIPTION OF THE PREFERRED EMBODIMENT

Figure 1:
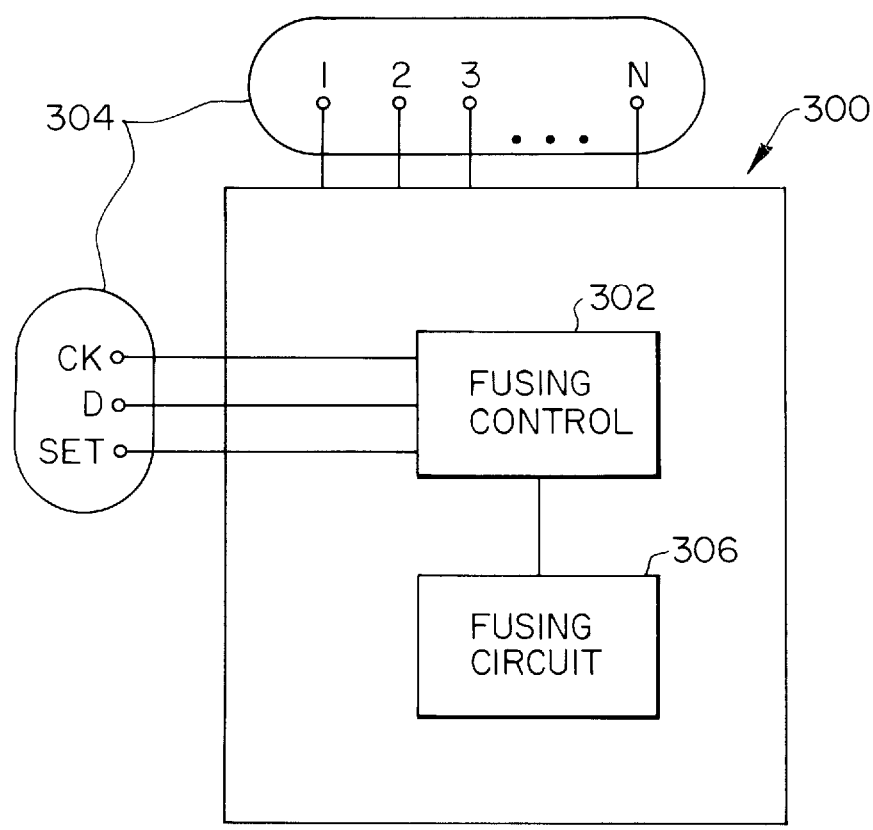
FIG. 1 is a block diagram of a semiconductor IC package provided with a fusing system in accordance with one embodiment of the present invention.

Referring now to the drawings in greater detail, FIG. 1 shows a block diagram of a semiconductor IC package 300 which is provided with a plurality of external pins (IC terminals) 304. Semiconductor IC package 300 includes, among other elements (not shown), a fusing control circuit 302 which is connected to a fusing circuit 306. The plurality of IC terminals 304 comprise a subset of k fusing control terminals, which specifically include control terminals CK, D, and SET in the embodiment illustrated in FIG. 1. IC terminals 304 further comprise 1-N external pins which may be provided for connecting various components of an IC provided within semiconductor IC package 300.

Semiconductor IC package 300 may comprise, for example, a transistor type metal can, a molded plastic or ceramic dual-in-line (DIP) package, a ceramic flat pack, or a hermetic or plastic chip carrier. Instead of a semiconductor IC package, the IC be mounted using, for example, a leaderless chip carrier, a pin grid array, or surface-mount technology.

Fusing control circuit 302 receives fusing control signals CK, D, and SET, and outputs signals to control fusing circuit 306, which selectively breaks or leaves intact specific fusible links (not shown in FIG. 1). By selectively breaking or leaving intact specific fusible links, the IC can be customized or otherwise adjusted so that it comprises certain desired optimal electrical characteristics in accordance with its intended design.

FIG. 2 shows a block diagram of a fusing system 5 according to one embodiment of the present invention. An interface circuit 1 receives a set signal from a setting terminal SET, a clock signal from a clock terminal CK, and a serial data signal from a data terminal D. Interface circuit 1 outputs an internal clock signal CK1, an internal data signal D1, and an internal setting signal SET1. A logic circuit 2 receives the internal signals CK1, D1, and SET1 output by interface circuit 1.

The illustrated fusing system 5 receives a clock signal CK, a serial data signal D comprising an address portion and a data portion, and a set signal SET. Fusing system 5 comprises an interface circuit 1, a logic circuit 2, and a fusing circuit 3.

The interface circuit 1 adjusts clock signal CK, serial data signal D and set signal SET by eliminating noise or amplifying the voltage level of each signal to a value high enough to drive the fusing system, generating an internal clock signal CK1, an internal serial data signal D1, and an internal set signal SET1. A specific example of an interface circuit 1 is shown in FIG. 3B which will be described further below.

Logic circuit 2, when in an adjustment mode, generates a plurality of temporary switching control signals and outputs them as switching control signals ADJ1–ADJn. The temporary switching control signals are generated according to the internal serial data signal D1, and may be used to set an electrical characteristic of the IC. Based upon the performance of the desired electrical characteristic of the IC which may be determined by testing of the IC, an "optimum" serial data signal may be ascertained which corresponds to a desired (optimum) performance of that portion of the IC. A plurality of fusing element selection signals CADJ1–CADJn for selecting fusing elements to be blown will be defined according to the ascertained optimum serial data signal.

Fusing circuit 3 blows selected fusing elements in accordance with the fusing element selection signals CADJ1–CADJn, consequently (later in a normal mode) generating a plurality of resultant fusing circuit signals FADJ1–FADJn.

Figure 3A:
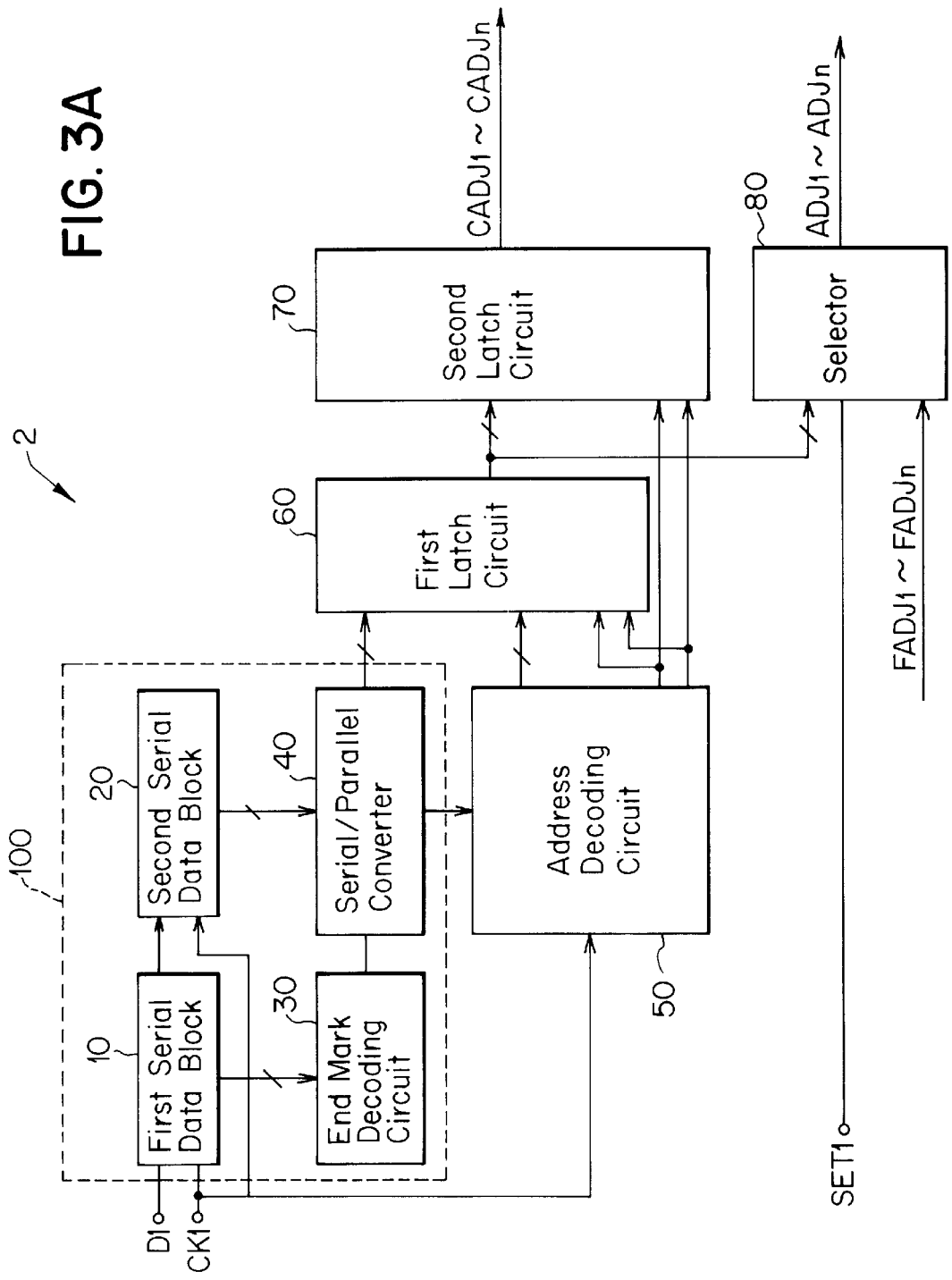
FIG. 3A is a detailed block diagram illustrating a logic circuit which may be provided in connection with the fusing system illustrated in FIG. 2.
Figure 3B:
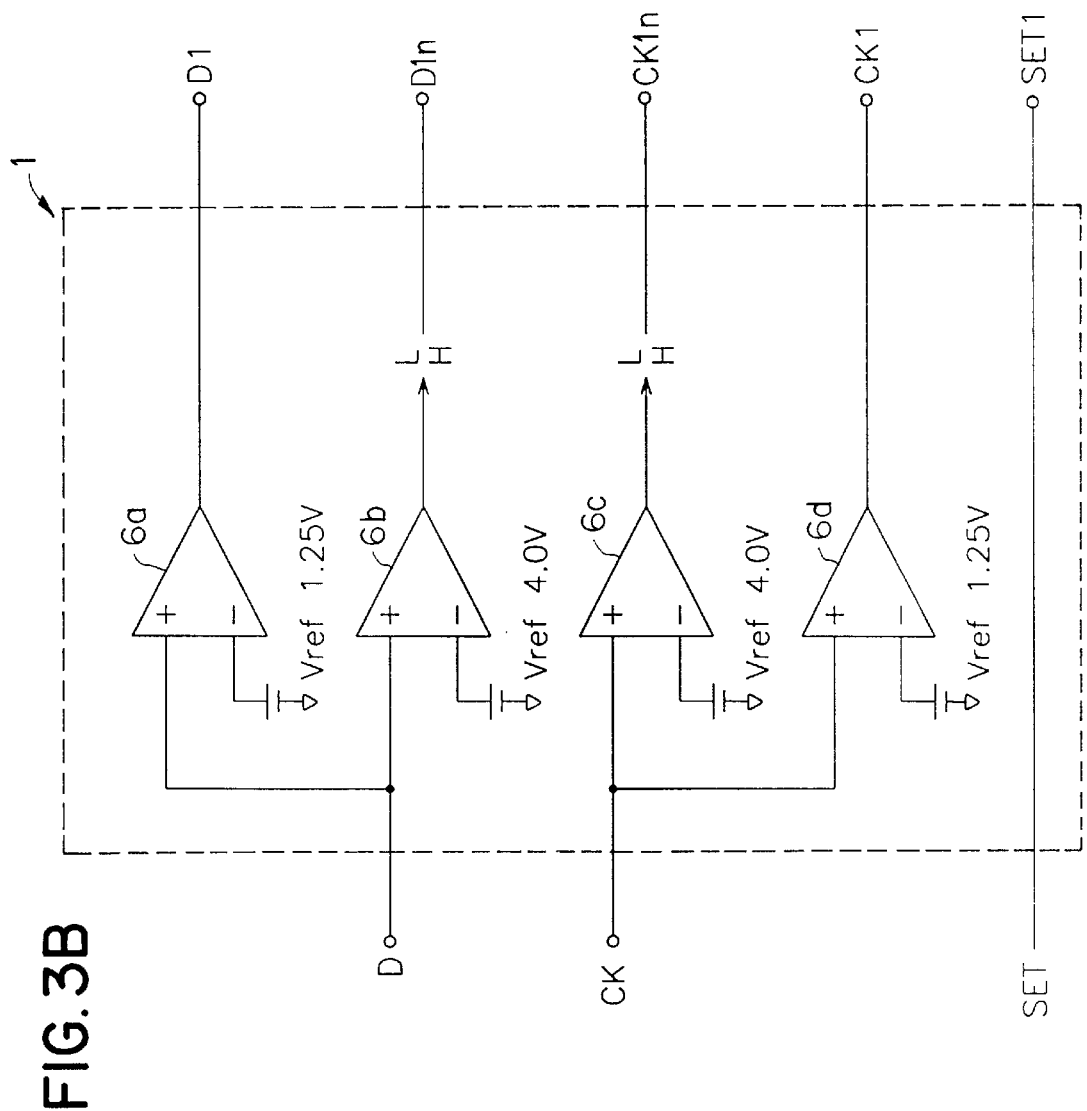
FIG. 3B is an exemplary interface circuit which may be provided as part of the fusing system shown in FIG. 2.

Referring to FIG. 3A, logic circuit 2 may further include a data storage 100 for sequentially receiving the internal serial data D1 according to the internal clock signal CK1 to generate addresses and data in parallel. Data storage 100 may specifically comprise a first serial data block 10, a second serial block 20, an end mark decoding circuit 30, and a serial/parallel converter 40. First serial data block 10 receives serial data signal D1 and internal clock signal CK1. Second serial data block 20 receives signals from the first serial data block 10 in sequence. End mark decoding block 30 is connected to first serial data block 10 for decoding the end mark. A serial/parallel converter 40 is connected to second serial data block 20 and end mark decoding block 30.

An address decoding circuit 50 is provided connected to serial/parallel converter 40. A first latch circuit 60 is provided connected to address decoding circuit 50 and to serial/parallel converter 40. A second latch circuit 70 is also provided connected to address decoding circuit 50 and first latch circuit 60. A selector 80 is provided to which the input signal to first latch circuit 60 is applied.

Figure 4:
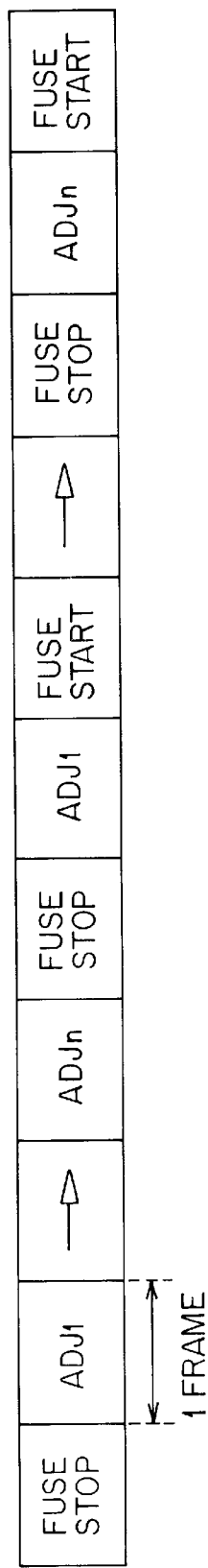
FIG. 4 is a block diagram depicting serial data that may be received and processed by the logic circuit shown in FIG. 3.

In the illustrated embodiment, the serial data D (and the internal serial data D1) comprises a plurality of fuse stop blocks FUSE STOP, a plurality of actual data blocks ADJ1–ADJn, and a plurality of fuse start blocks FUSE START as shown, for example, in FIG. 4. The fuse stop block FUSE STOP is used to reset the serial data block.

Figure 5:
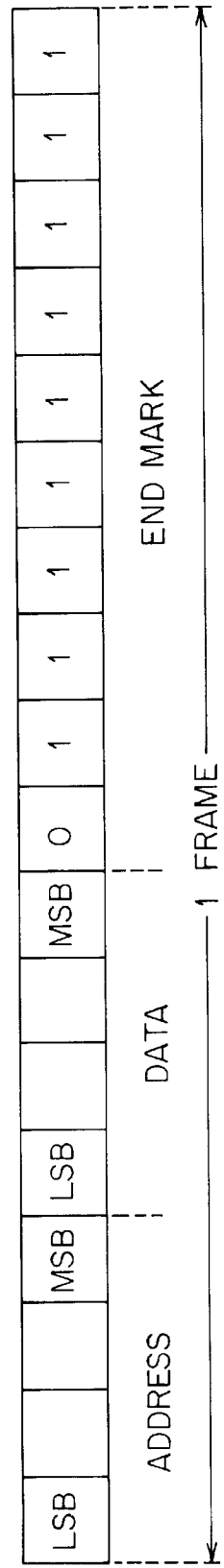
FIG. 5 is a block diagram of one unit (a frame) of serial data shown in FIG. 4.

One frame of serial data is illustrated in detail in FIG. 5. The frame of serial data shown in FIG. 5 includes an initial address portion, a data portion, and an end mark.

FIG. 3B is a circuit diagram of an interface circuit 1 which may be provided in the fusing system 5 illustrated in FIG. 2. In the circuit illustrated in FIG. 3B, a plurality of operational amplifiers 6a–6d are provided. Interface circuit 1 includes a plurality of input terminals which receive a serial data signal D, a clock signal CK, and a set signal SET. A plurality of output terminals are provided for outputting an internal serial data signal D1, an internal clock signal CK1, and an internal set signal SET1. Output terminals are also provided for outputting an internal serial data signal D1n for use in a normal mode, and an internal clock signal CK1n for use in a normal mode.

The signals including D1, CK1, and SET1 are the output signals which are used during adjusting and fusing modes of fusing system 5 illustrated in FIG. 2. For these signals, interface circuit 1 serves to eliminate noise and/or amplify the voltage level of these three signals to values sufficient to drive the fusing system. The adjusting, fusing, and normal modes will be described in more detail below. In the normal mode, the SET terminal may be connected to ground, and the serial data terminal D and clock terminal CK can each be used as data pins which form external pins of a semiconductor IC package, and thus can be used for purposes other than adjusting and fusing in the adjusting and fusing modes of fusing system 5. In this manner, the number of external pins of a semiconductor IC package can be utilized to their fullest extent, and it is not necessary to provide a large number of extra external pins for purposes of adjusting and fusing.

The operation of the fusing system 5 shown in FIG. 2 will now be described, with reference to FIGS. 2–5. As noted above, the fusing system 5 may be operated in one of an adjustment mode, a fusing mode and a normal mode. In the adjusting mode, testing is performed on the IC using the fusing system in order to determine what points should be fused, i.e., which fusible links should be fused, by fusing circuit 3 in order to obtain the most suitable (optimum/desired) set of electrical characteristics. More specifically, control data ADJ1–ADJn is output by logic circuit 2 in accordance with (equal to, in the specific illustrated embodiment) the serial data D being input to interface circuit 1. That control data is used to control the setting of certain electrical characteristics of the IC. Depending upon the resulting electrical characteristic of the IC corresponding to a particular control data ADJ1–ADJn (determined by testing), the input serial data D is changed, until an optimum electrical characteristic is obtained. The specific input serial data corresponding to the obtained optimum gain control data ADJ1–ADJn is then used later in the fusing mode to blow select fuses according to the optimum gain control data obtained during the adjusting mode. During the adjusting, no fuses are blown.

Then, during a fusing mode, logic circuit 2 causes select fuses to be blown in accordance with the optimum gain control data obtained during the adjusting mode. During the normal mode, since the select fuses have been blown by fusing circuit 3, fusing circuit 3 generates, in accordance with the arrangement of broken or intact fusible links, fixed switching control signals FADJ1–FADJn which serve as electrical characteristic control data ADJ1–ADJn.

Referring again to FIG. 5, the value of each address within a frame corresponds to a different respective IC test device. Each IC test device receives a value, such as a frequency or a voltage level, from the IC and determines whether that value is in a pre-determined (desired) range and determines the value of the address. Depending upon the number of bits of the address, a number of different values may be tested. For example, if the address contains n bits, a total number of $2^n$ IC values may be adjusted in the adjusting mode. The data blocks may similarly correspond to respective values being adjusted within the IC, in accordance with the accompanying address in that particular frame.

Referring to the serial data illustrated in FIG. 4, the data which follows the FUSE STOP signal is output directly from logic circuit 2 as data ADJ1–ADJn. Data following a FUSE START signal is forwarded to fusing circuit 3 and thus comprises signals CADJ1–CADJn.

Once serial data D is applied together with a clock signal CK and the circuitry is powered, the appropriate information is received by logic circuit 2 through interface circuit 1. Then, the operation of fusing system 5 is commenced. Referring to FIG. 3A, a first serial data block 10 receives serial data D through a terminal and is connected to a second serial data block 20, so that the data is sequentially input to block 20. Then, the end mark of the serial data which has been input to first serial data block 10 is input to an end mark decoding circuit 30. End mark decoding circuit 30 senses when one frame of data has been input thereto. First serial data block 10 has the end mark, while next serial data block 20 has the address and data.

Then, a serial/parallel converter 40 receives serial data D from second serial data block 20, and end mark decoding circuit 30 converts that data into a parallel format, and inputs the converted signal into an address decoding circuit 50.

Address decoding circuit 50 senses the address, determines whether to use an adjusting mode or a fusing mode in accordance with that address, and sends the data to the appropriate address corresponding to that determination. In an adjusting mode, address decoding circuit 50 transmits the data to a selector 80 through first latch circuit 60. In a fusing mode, address decoding circuit 60 transmits the data CADJ1–CADJn to fusing circuit 3 through first latch circuit 60 and second latch circuit 70.

Next, fusing circuit 3 fuses select fusible links in accordance with the input data CADJ1–CADJn, and then transmits fusing data FADJ1–FADJn (otherwise referred to as fixed switching control signals for calibration/setting of certain portions of the IC) so that the IC can be calibrated/set to operate in a way that its electrical characteristics are at desired or optimum levels.

Figure 6:
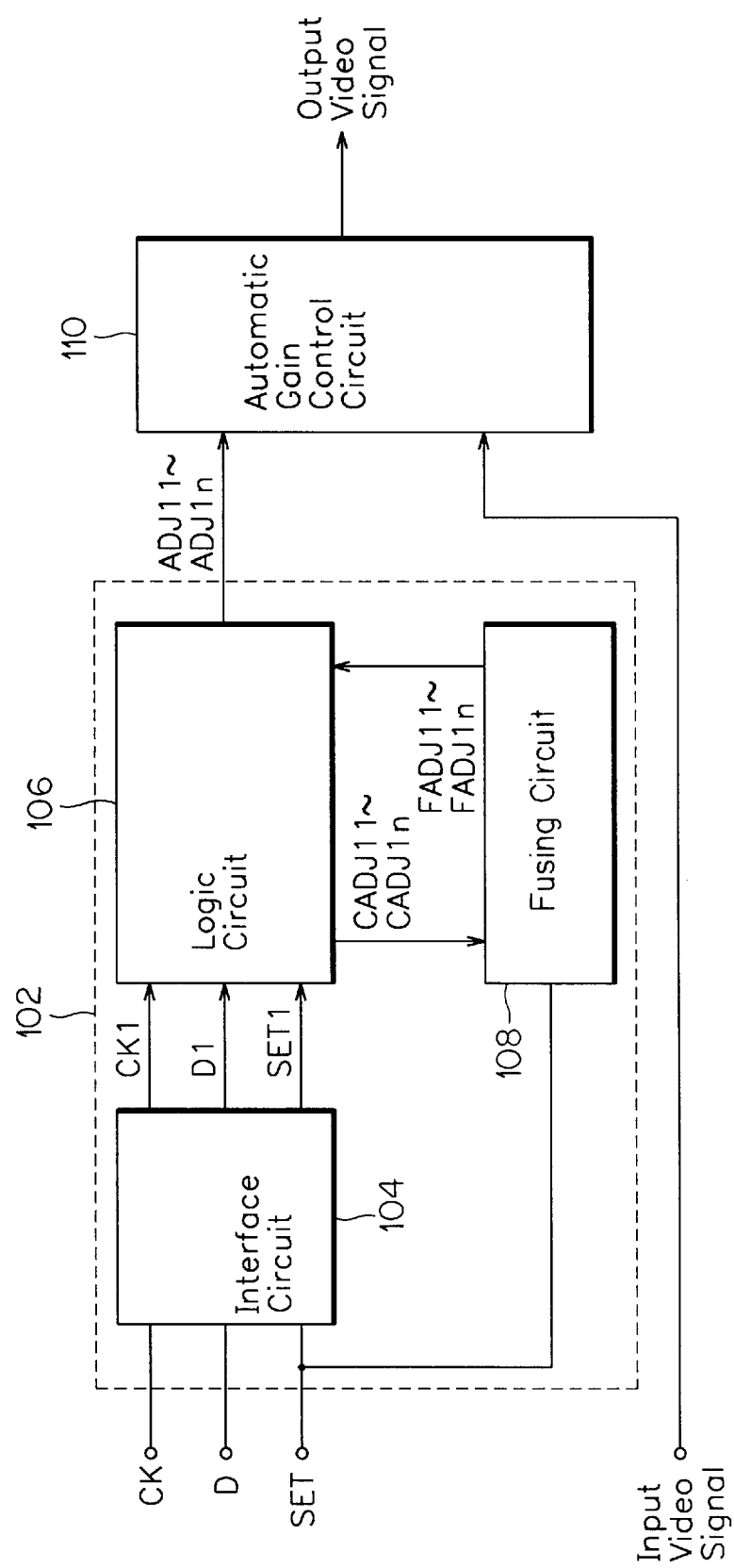
FIG. 6 is a block diagram of a fusing system which may be provided in connection with an AGC circuit for adjusting the signal level of a video signal.

The total number of pins of the IC (package) may be 64 pins of a video signal processing circuit IC of a VCR, wherein three pins are used for controlling fusing and adjusting modes of the fusing system. In the specifically illustrated embodiment of FIG. 6, all pins of the IC may be used for data processing purposes, except for the SET terminal pin. Accordingly, 63 out of 64 total external pins may be utilized for data processing or other IC-specific functions. The above-mentioned fusing system has advantages in that it prevents adjustment of the electrical characteristics of the IC during the fusing process. Fusing system 5 determines which point (which fusible link) is the most suitable fusible link for the IC electrical characteristic being adjusted, and carries out the steps of the fusing process based upon that determined fusing point to obtain preferred uniform electrical characteristics.

Accordingly, an IC can be manufactured with such a fusing system at a lower cost while improving the electrical characteristics across the device.

FIGS. 6–10 illustrate a fusing system used together with an automatic gain control system provided on an IC. Specifically, in FIG. 6, an exemplary embodiment of an automatic gain control system having a fusing system is shown. The illustrated automatic gain control system includes a fusing system 102.

Fusing system 100 has a plurality of fusing elements. The illustrated automatic gain control system further includes an automatic gain control (AGC) circuit 110. The fusing elements are preferably each made of a material such as metal and polysilicon that blows (melts) at a given current.

Fusing system 102 receives a clock signal CK, a serial data signal D comprising an address part and a data part, and a SET signal for controlling AGC circuit 110 to generate a plurality of switching control signals of high or low logic value. Fusing system may be provided with an interface circuit 104, a logic circuit 106, and a fusing circuit 108.

Interface circuit 104 adjusts the clock signal CK, serial data signal D, and set signal SET by eliminating noise or amplifying the voltage level of each signal to a value high enough to drive the fusing system, generating an internal clock signal CK1, an internal serial data signal D1, and an internal set signal SET1.

The logic circuit 106, when in an adjustment mode, generates a plurality of temporary switching control signals and outputs them as switching control signals ADJ11–ADJ1N. The temporary switching control signals are generated according to the internal serial data signal D1 and are used to set an initial adjustment element (e.g., the non-inverting input of amplifier 130) of an AGC circuit. Based upon the performance of automatic gain control circuit 110, an "optimum" serial data signal is ascertained which corresponds to a desired (optimum) performance of automatic gain circuit 110. A plurality of fusing element selection signals CADJ11–CADJ1n for selecting fusing elements to be blown will be defined according to the ascertained optimum serial data signal.

Fusing circuit 108 blows selected fusing elements in accordance with the fusing element selection signals CADJ11–CADJ1n, consequently generating a plurality of resultant fusing circuit signals FADJ11–FADJ1n.

Figure 7:
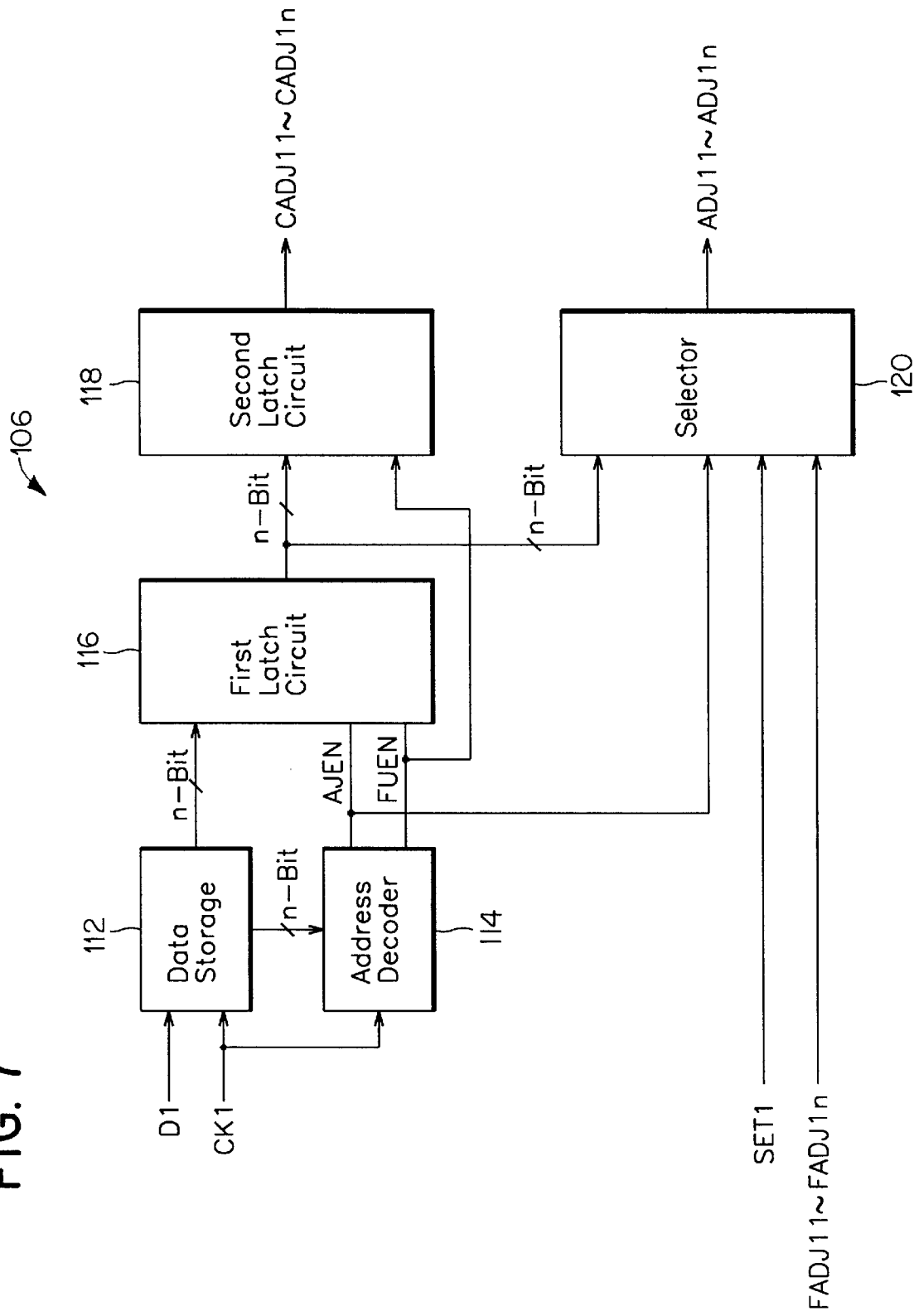
FIG. 7 is a block diagram of a logic circuit which may be provided in the AGC control system illustrated in FIG. 6.

Referring to FIG. 7, logic circuit 20 further includes a data storage 112 for sequentially receiving the internal serial data D1 according to the internal clock signal CK1 to generate the addresses and data in parallel. An address decoder 114 is provided for decoding the addresses to generate an adjustment mode enabling signal AJEN and a fusing mode enabling signal FUEN. A first latch circuit 116 latches the parallel output data when the adjustment mode or the fusing mode enabling signal AJEN or FUEN is activated. A second latch circuit 118 latches the data stored in first latch circuit 116 to generate the fusing element selection signals CADJ11–CADJ1n only when the fusing mode enabling signal FUEN is activated. A selector (hereinafter called a "data selection circuit") 120 generates the switching control signals ADJ11–ADJ1n by selecting the data stored in first latch circuit 116 or the resultant fusing circuit signals FADJ11–FADJ1n according to whether the internal set signal SET1 is activated or not together with the activation of the adjustment enabling signal AJEN.

Figure 8A:
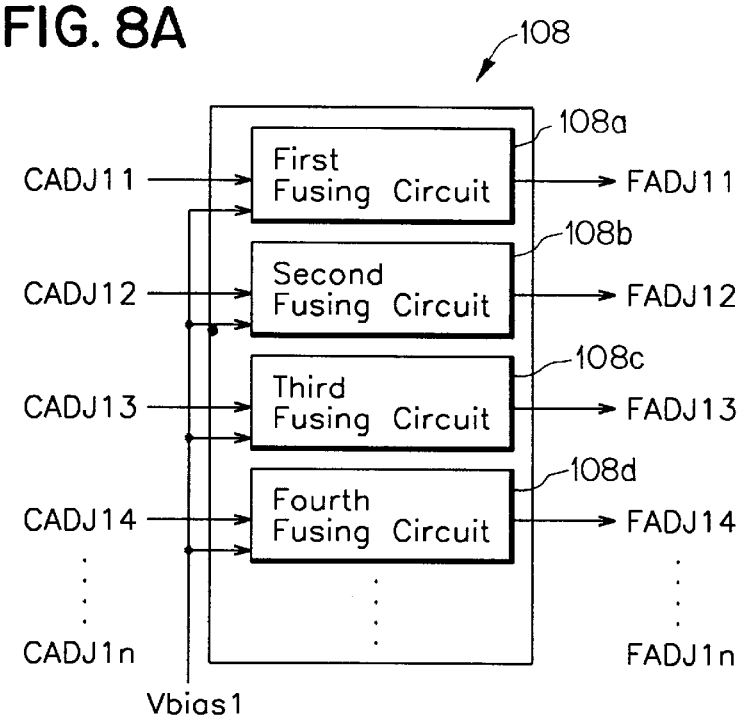
FIG. 8A is a block diagram illustrating a fusing circuit of the fusing system illustrated in FIG. 6.
Figure 8B:
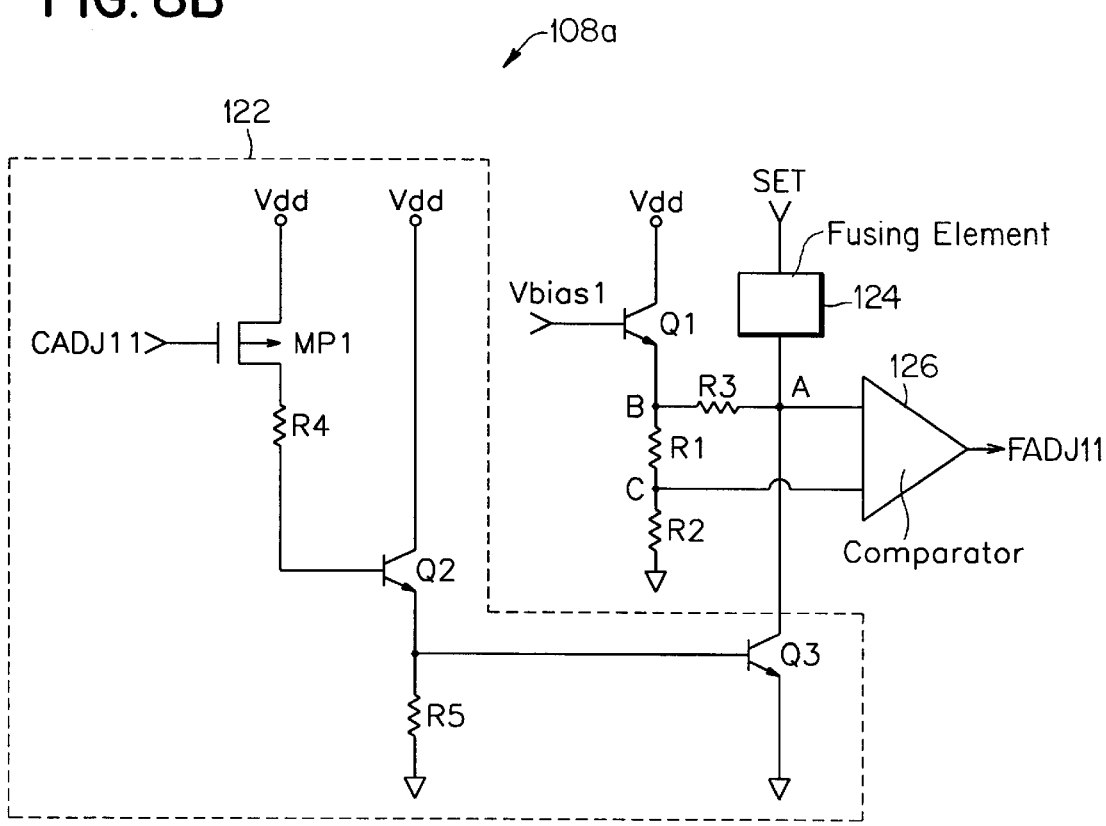
FIG. 8B is a detailed circuit diagram of one fusing circuit shown in FIG. 8A.

As shown in FIGS. 8A and 8B, the fusing circuit 108 of the illustrated embodiment has a plurality of fusing parts of the same structure as shown in FIG. 8B, and therefore description will be made only in connection with first fusing circuit 108a for the sake of convenience. First fusing circuit 108a may include several elements as shown in FIG. 8B. Referring to FIG. 8B, a fusing element 124 is connected between the set signal SET and a first node A. A fusing enabling circuit 122 is provided for passing a first fusing signal according to the first fusing element selection signal CADJ11 of the logic adjustment circuit 20 to fuse (blow or melt) the first fusing element 122. A first bipolar transistor Q1 has a collector connected to a power supply Vdd, a base connected to a first bias voltage Vbias1, and an emitter connected to a second node B. A first resistor R1 is connected between a second node B and a third node C, and a second resistor R2 is connected between the third node C and ground. A first comparator 126 is provided for generating a first fusing resultant signal FADJ11 of logically low or high value according to the voltages of the first and second nodes A and B.

Fusing enabling circuit 122 includes a first PMOS transistor MP1 turned on or off according to the logically high or low value of the first fusing element selection signal CADJ11. A second bipolar transistor Q2 is provided which is turned on or off according to the on or off state of the first PMOS transistor MP1, and a third bipolar transistor Q3 is provided which is either saturated or turned off according to the on or off state of the second bipolar transistor Q2.

Figure 9:
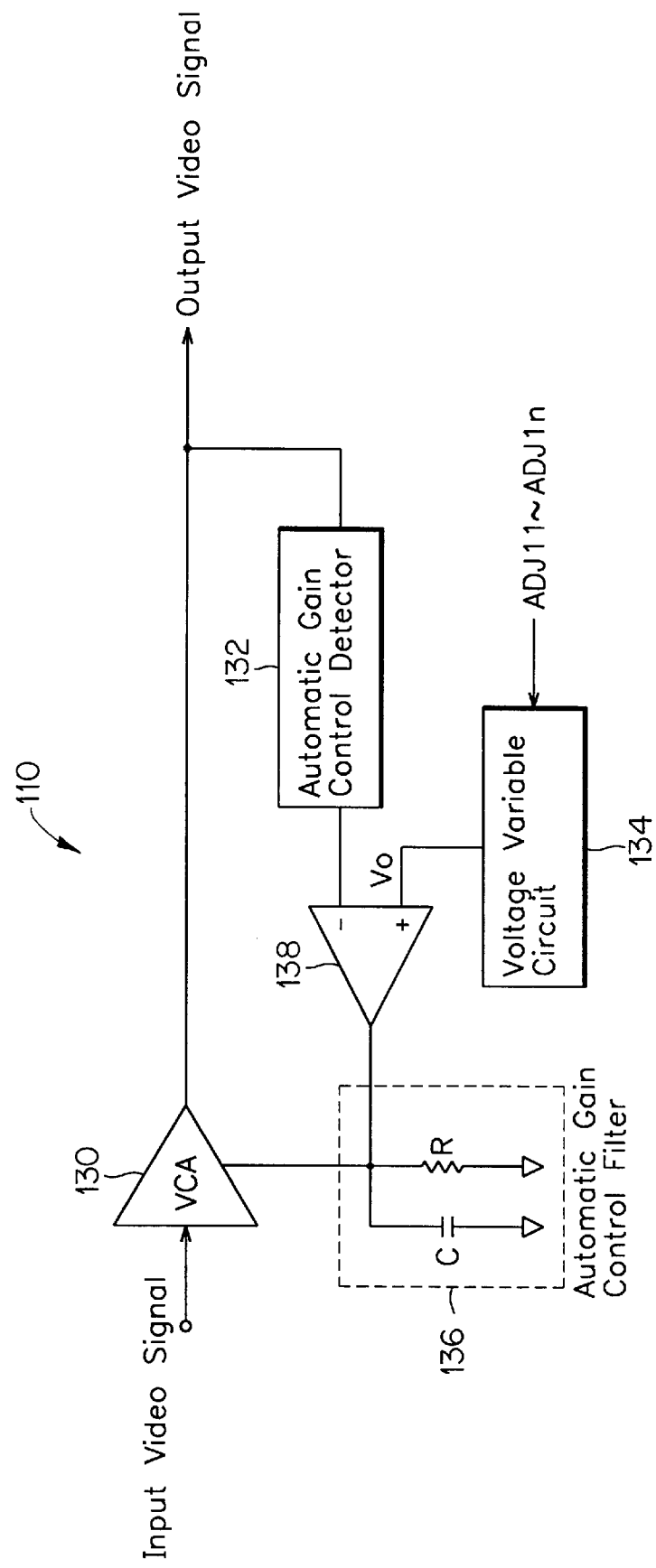
FIG. 9 is a block diagram illustrating the AGC circuit of the AGC system shown in FIG. 6.

As shown in FIG. 9, the illustrated automatic gain control circuit 110 includes a voltage controlled amplifier (VCA) 130 with an input, an output, and a control terminal for amplifying an input video signal under the control of an automatic gain control signal applied to the control terminal. An automatic gain control detector 132 is provided for detecting the amplified video signal of the VCA 130. A variable voltage circuit 134 varies a current value according to the logical values of the switching control signals ADJ11–ADJ1n to generate the optimum gain reference voltage Vo.

A differential amplifier 130 amplifies a difference between the output voltage of the automatic gain control detector 132 and the output of variable voltage circuit 134. An automatic gain control filter 136 is provided for smoothing the output of the amplifier 138 to generate the automatic gain control signal.

Figure 10:
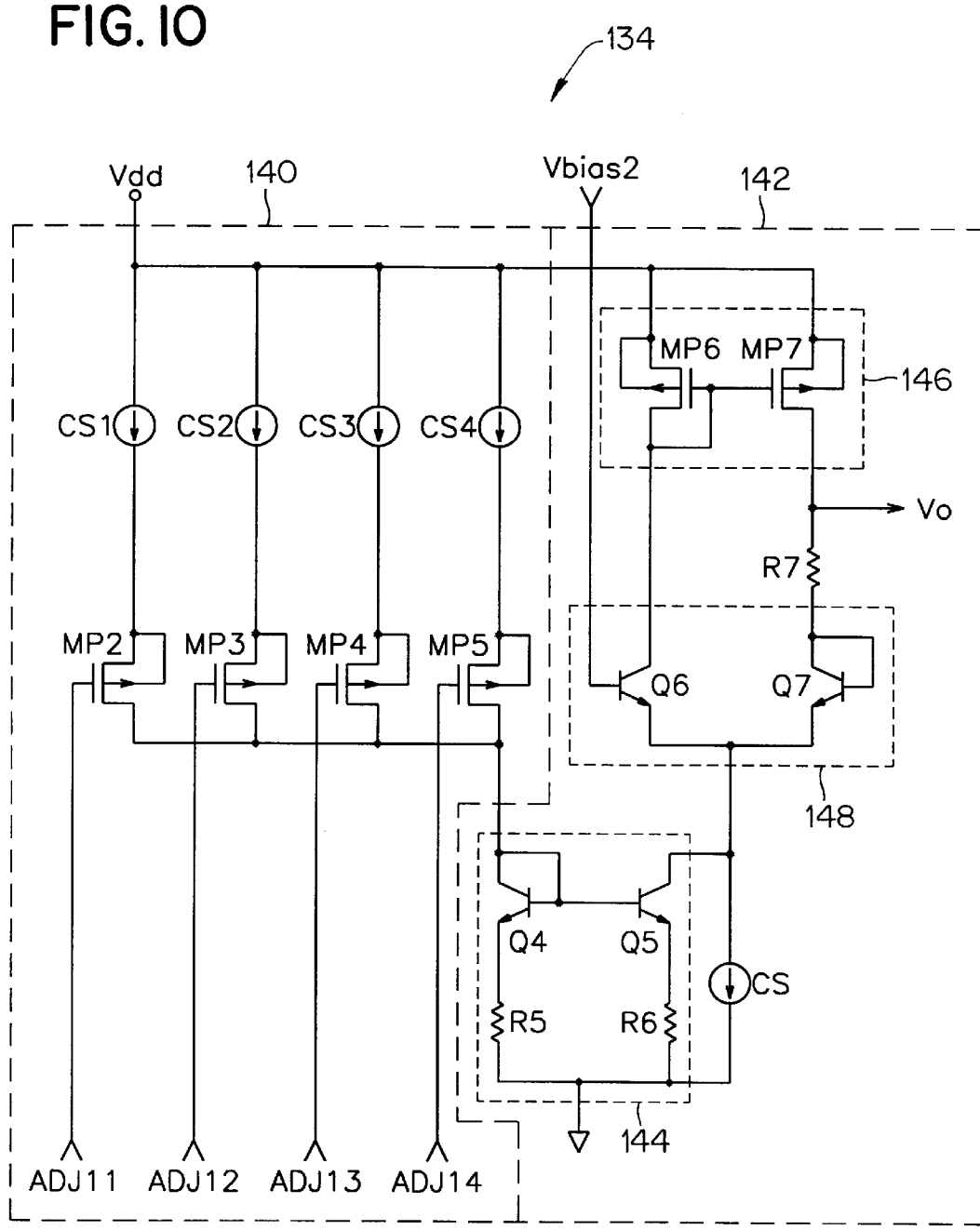
FIG. 10 is a circuit diagram of a variable voltage circuit which may be provided in the AGC circuit shown in FIG. 9.

As shown in FIG. 10, voltage variable circuit 134 has a current changing circuit 140 for changing the magnitude of a current according to the logical values of the switching control signals ADJ11–ADJ1n, and a current/voltage converting circuit 142 for generating a variable voltage Vo which is changed according to the current of the current changing circuit 140.

The current changing circuit 140 includes a plurality of current sources CS1, CS2, CS3, CS4 for supplying a given current, and a plurality of PMOS transistors MP2, MP3, MP4, MP5 each with a gate connected to one of the switching control signals ADJ11–ADJ1n and a drain connected to a common line.

The illustrated current/voltage converting circuit 142 includes a first mirror circuit 144 comprising fourth and fifth bipolar transistors Q4 and Q5 and two resistors R5 and R6. A second mirror circuit 146 is provided comprising two PMOS transistors MP6 and MP7. A voltage shifter 148 comprises sixth and seventh bipolar transistors Q6 and Q7, a resistor R7, and a current source CS.

First mirror circuit 144 is designed so that fifth bipolar transistor Q5 is supplied with the same current as fourth bipolar transistor Q4 or the resultant current obtained by adjusting the ratio between the two resistors R5 and R6. Likewise, second mirror circuit 146 is designed so that PMOS transistor MP7 is supplied with the same current as the other PMOS transistor MP6. Also, voltage shifter 148 is designed so that the collector of seventh bipolar transistor Q7 is supplied with a voltage identical with the bias voltage applied to its base.

In first mirror circuit 144, the base and collector of the fourth bipolar transistor Q4 are each connected to the drains of the PMOS transistors of current changing circuit 140. The emitter of fourth bipolar transistor Q4 is connected to one end of resistor R5, and the other end of resistor R5 is grounded. Fifth bipolar transistor Q5 has its base connected to the base of fourth bipolar transistor Q4, and its emitter connected to one end of the resistor R6, and the other end of resistor R6 is grounded. The collector of fifth bipolar transistor Q5 is connected to one end of current source CS, and ground is connected to the other end of current source CS.

In second mirror circuit 146, the source of the PMOS transistor MP6 is connected with a power supply Vdd, and its gate and drain are commonly connected to the gate of PMOS transistor MP7. The source of PMOS transistor MP7 is also connected to the power supply Vdd, and its drain is connected to one end of resistor R7 and to the node corresponding to the output variable voltage Vo.

In voltage shifter 148, the collector of sixth bipolar transistor Q6 is connected to the gate (and drain) of PMOS transistor MP6. The base is connected to a given bias voltage Vbias2, and the emitter is connected to one end of current source CS. The collector and base of seventh bipolar transistor Q7 are each connected to the other end of resistor R7, and the emitter is connected to the emitter of sixth bipolar transistor Q6. The other end of the current source CS is grounded.

In operation, the illustrated embodiment automatic gain control system, which includes a fusing system, has three kinds of modes. The first mode is the adjustment mode for obtaining the optimum gain control data needed to make the voltage controlled amplifier of the AGC circuit generate a gain at optimum value. The obtained optimum gain control data is used to select the fusing elements to be blown to effect a desired adjustment of the AGC in accordance with the obtained optimum gain control data. The second mode is the fusing mode for blowing the fusing elements selected according to the optimum gain control data obtained in the first mode. The third mode is the normal mode for providing fixed switching control signals to calibrate (set) the AGC circuit based upon the optimum gain control data obtained in the first mode. The set signal SET has a high logic value during the adjustment and fusing modes, and a low logic value during the normal mode.

Interface circuit 104 may be provided to adjust the clock signal CK, serial data signal D, and/or set signal SET by eliminating noises or amplifying the voltage levels to values sufficient to drive the fusing system. As a result of that adjustment, interface circuit 104 generates the internal clock signal CK1, internal serial data D1, and internal set signal SET1. Of course, interface circuit 104 is not necessary if the externally input signals CK, D, and SET have no noise and have voltage levels high enough to drive logic circuit 106. Interface circuit 104 may, e.g., be implemented in accordance with the circuit illustrated in FIG. 3B.

Describing the operation of logic circuit 106 with reference to FIG. 7, data storage 112 sequentially receives the internal serial data D1 according to the internal clock signal CK1 to generate the addresses and data in parallel. Address decoder 114 decodes the addresses to generate adjustment and fusing mode enabling signals AJEN and FUEN, according to which the first latch circuit 116 latches on the parallel output data. Namely, when address decoder 114 receives the addresses representing the adjustment mode, the adjustment mode enabling signal AJEN is activated and the fusing mode enabling signal FUEN deactivated, so that first latch circuit 116 is enabled to latch on the data stored in the data storage 112, and the second latch circuit 118 is disabled to generate the fusing element selection signals CADJ11–CADJ1n all logically high. Since the adjustment enabling signal AJEN and the internal set signal SET1 are activated, the data selection circuit 120 selects the data stored in the first latch circuit 116 to generate the switching control signals ADJ11–ADJ1n. Namely, in the adjustment mode, the data of the serial data signal D are identical with the data of the switching control signals ADJ11–ADJ1n.

When address decoder circuit 114 receives addresses representing the fusing mode, the adjustment mode enabling signal AJEN is deactivated, and the fusing mode enabling signal FUEN activated. Accordingly, first and second latch circuits 116 and 118 are all enabled to cause second latch circuit 118 to receive the data latched by first latch circuit 116 and to generate the fusing element selection signals CADJ11–CADJ1n.

In the normal mode, since the internal set signal SET1 has a low logic signal, data selection circuit 120 selects the resultant fusing circuit signals FADJ11–FADJ1n (fixed switching control signals) output by fusing circuit 108 to be the switching control signals ADJ11–ADJ1n.

Fusing circuit 108 will now be described, together with automatic gain control circuit 110, and voltage variable circuit 134, with reference to FIGS. 8A, 8B, 9, and 10.

In the adjustment mode, since fusing circuit 108 receives fusing element selection signals CADJ11–CADJ1n which are all logically high, PMOS transistor MP1 of fusing enabling circuit 31 is turned off, and second and third bipolar transistors Q2 and Q3 are thus off. Accordingly, at this time, none of the fusing elements of fusing circuit 108 are fused (blown). Moreover, the data of the serial data signal D is identical with the data of the switching control signals ADJ11–ADJ1n. In this case, assuming that all the data of the serial data signal D have a logically high value and all the current sources produce a current of 100 $\mu$A, all the PMOS transistors serving as switching elements as shown in FIG. 10 are turned off, so that fourth bipolar transistor Q4 is turned off. Therefore, half the current of the current source CS flows through PMOS transistors MP6 or MP7 of second mirror circuit 146.

Meanwhile, the base of the bipolar transistor Q6 of voltage shifter 148 is supplied with the second bias voltage Vbias2, and thus the collector of bipolar transistor Q7 is also supplied with the second bias voltage. Accordingly, the output variable voltage Vo of variable voltage circuit 138 has a value equal to R7×CS/2+Vbias2.

In this case, if one of the switching control signals ADJ11–ADJ1n has a logically low value causing only the corresponding PMOS transistor to be turned on, the base of bipolar transistor Q4 of first mirror circuit 144 is supplied with a current of 100 $\mu$A from the corresponding current source. Accordingly, bipolar transistor Q4 is turned on, and bipolar transistor Q5 saturated. As a result, in accordance with the ratio between resistors R5 and R6, the magnitude of the current flowing through bipolar transistor Q5 is determined. For example, if resistor R5 has the same resistance value as resistor R6, bipolar transistor Q5 will have the same current as bipolar transistor Q4. Hence, (CS/2)+50 $\mu$A will flow through each of PMOS transistors MP6 and MP7 of second mirror circuit 146, so that the output variable voltage Vo of voltage variable circuit 138 becomes R7×((CS/2)+50)+Vbias2.

Thus, the PMOS transistors of the current changing circuit 140 shown in FIG. 10 are selectively turned on to control the current flowing through the first mirror circuit, so that the variable voltage Vo is determined. The determined variable voltage Vo is applied to the reference terminal (the non-inverting input) of the differential amplifier 138 as shown in FIG. 9, determining the optimum gain control data which is applied to the control terminal of voltage controlled amplifier 130. The fusing element selection signals CADJ11–CADJ1n generated from the logic circuit 106 represent the optimum input data D.

Fusing circuit 108 selectively fuses the fusing elements according to the fusing element selection signals CADJ11–CADJ1n. For example, if the first fusing element selection signal CADJ11 has a high logic value, the fusing element 124 is not fused because the first PMOS transistor MP1 is turned off, and therefore bipolar transistors Q2 and Q3 are off. On the contrary, if the first fusing element selection signal CADJ11 has a low logic value, the fusing element 124 is fused because the first PMOS transistor MP1 is turned on, and therefore bipolar transistors Q2 and Q3 are on so as to connect the terminal of the set signal SET with the voltage Vdd. Thus, the fusing elements of fusing circuit 108 are selectively fused in the fusing mode according to the optimum gain control data obtained in the adjustment mode, permanently fixing the function of the fusing system 102.

Referring to FIG. 8B, when fusing element 124 is blown in the fusing mode, the first node A has a higher voltage than the third node C, so that the first resultant fusing circuit signal FADJ11 output by comparator 126 has a low logic value. On the contrary, when fusing element 124 is not blown, the first node A receives a low logic value from the SET terminal, which is lower than that of the third node C, so that the first resultant fusing circuit signal FADJ11 has a high logic value. Consequently, the resultant fusing circuit signals FADJ11–FADJ1n serve as the "fixed" switching control signals ADJ11–ADJ1n which will be applied during the normal mode to the voltage variable circuit 134 in order to produce the optimum gain reference voltage Vo applied to the positive (non-inverting) input terminal of differential amplifier 138 of automatic gain control circuit 110. The optimum gain reference voltage Vo serves as the reference point with which the output of the automatic gain control detector 132 is compared to give the automatic gain control signal applied to the control terminal of the voltage controlled amplifier 130.

While the invention has been described by way of example embodiments, it is understood that the words which have been used herein are words of description, rather than words of limitation. Changes may be made, within the purview of the appended claims, without departing from the scope and spirit of the invention in its broader aspects. Although the invention has been described herein with reference to particular means, materials, and embodiments, it is understood that the invention is not limited to the particulars disclosed. Rather, the invention extends to all equivalent structures, means, and uses such as those which are within the scope of the appended claims.

What is claimed is:

1. An automatic gain control system for automatically controlling a signal strength of a video signal output from a video processing circuit, said system comprising:

an automatic gain control circuit, said automatic gain control circuit having at least one amplifier, a signal strength detector for detecting a signal strength and producing a signal strength indicating signal, and adjusting means for automatically adjusting a gain of said at least one amplifier in accordance with said signal strength indicating signal; and a setting circuit for setting an initial adjustment element of said automatic gain control circuit, said adjusting means automatically adjusting the gain of said at least one amplifier to a gain value determined as a function of both said initial adjustment element and said signal strength indicating signal, said setting circuit comprising a plurality of fuses, and means for outputting a setting signal in accordance with conduction states of said plurality of fuses.

2. An automatic gain control system according to claim 1, further comprising a logic adjustment circuit having receiving means for receiving a clock signal, serial input data, and a set signal and generating means for generating a plurality of temporary switching control signals according to said serial input data, said serial input data comprising an address signal and a data signal, said setting signal comprising a plurality of resultant setting circuit signals, said logic adjustment circuit further comprising means for setting said switching control signals to be either said temporary switching control signals or said resultant setting circuit signals in accordance with a signal level of said set signal.

3. An automatic gain control system according to claim 2, wherein said switching control signals are set to be said resultant setting circuit signals when said signal level of said set signal is low.

4. An automatic gain control system according to claim 2, further comprising an adjustment mode interface circuit comprising means for adjusting said clock signal, said serial input data, and said set signal by eliminating noise and by amplifying voltage levels to values sufficient enough to drive said logic adjustment circuit.

5. An automatic gain control system according to claim 2, wherein said logic adjustment circuit further includes:

a data storage for sequentially receiving said serial input according to said clock signal, said data storage comprising means for generating output addresses and output data in parallel;

an address decoder for decoding said addresses to generate an adjustment mode enabling signal and a fusing mode enabling signal;

a first latch circuit for latching said output data when one of said adjustment mode signal and said fusing mode enabling signal is activated;

a second latch circuit for latching data stored in said first latch circuit to generate fusing element selection signals only when said fusing mode enabling signal is activated; and a data selection circuit for generating said switching control signals by selecting the data stored in said first latch circuit or said resultant setting circuit signals according to whether said set signal is activated concurrently with activation of said adjustment enabling signal.

6. An automatic gain control system according to claim 1, further comprising means for outputting fusing element selection signals to correspond to respective ones of said plurality of fuses, said setting circuit comprising fusing circuit which comprises a plurality of fusing parts; each said fusing part including a fusing element; a fusing enabling circuit for blowing said fusing element when a corresponding fusing element selection signal has a certain logic state and said set signal has a certain logic state, and a comparator for generating either a high or low corresponding resultant setting circuit signal according to whether said fusing element is blown.

7. An automatic gain control system according to claim 2, wherein said setting circuit further comprises a variable voltage circuit for outputting an output voltage in accordance with said switching control signals, said output voltage causing said initial adjustment element to be set, said variable voltage circuit comprising a current having a current source and changing circuit means for changing the magnitude of a current produced by said current source to produce a changed current according to the logic levels of said switching control signals, and a current/voltage converting circuit for generating said output voltage changed according to a magnitude of said changed current.

8. An automatic gain control system according to claim 7, wherein said changing circuit comprises a plurality of current sources for each supplying a given current, and a plurality of switching means for passing or not passing said given current according to whether said switching control signals have a low or high logic value.

9. An automatic gain control system according to claim 8, wherein said plurality of switching means comprise a plurality of PMOS transistors having gates connected to respective ones of said switching control signals, having sources connected to respective ones of said current sources, and having drains connected to a common line.

10. An automatic gain control system according to claim 7, said current/voltage converting circuit comprising:

a first mirror circuit comprising first and second bipolar transistors, and first and second resistors respectively connected at one end to emitters of said first and second bipolar transistors and at another end to ground, bases of said first and second bipolar transistors being commonly connected, the base and collector of said first bipolar transistor being connected to an output of said current changing circuit, an amount of current passing through said second bipolar transistor being equal to or less than an amount of current passing through said first bipolar transistor;

a second mirror circuit comprising first and second PMOS transistors and a third resistor, an amount of current flowing through said second PMOS transistor being equal to an amount of flowing through said first PMOS transistor, said second mirror circuit generating an output voltage according to the current flowing through said second PMOS transistor; and a current source for supplying said second mirror circuit with a current, the collector of said second bipolar transistor being connected to said current source.

11. An automatic gain control system according to claim 10, wherein said current/voltage converting circuit further comprises a voltage shifter for making the output of said second mirror circuit greater than an externally applied bias voltage.

12. An automatic gain control system according to claim 10, wherein the sources of said first and second PMOS transistors are connected to a voltage source, the gate and drain of said first PMOS transistor is connected to the gate of said second PMOS transistor, and the drain of said second PMOS transistor is connected to one end of said third resistor.

13. An automatic gain control system according to claim 10, wherein said voltage shifter comprises:

a third bipolar transistor having a base supplied with said an externally applied bias voltage and a collector connected to the drain of said first PMOS transistor; and a fourth bipolar transistor having a base and a collector each connected to another end of said third resistor, the emitters of said third and fourth bipolar transistors being commonly connected with said current source.

14. An automatic gain control system for automatically controlling the gain of a video signal, said system comprising:

an amplifier having two inputs for generating a gain control signal according to a difference between said two inputs;

a voltage controlled amplifier for amplifying said video signal under control of said gain control signal;

adjustment mode means for obtaining, during an adjustment mode, input serial data to make said voltage controlled amplifier have a gain at an optimum value;

fusing mode means including a plurality of fusing elements for blowing, during a fusing mode, selected ones of said fusing elements according to said input serial data obtained by said adjustment mode means; and normal mode means for fixing, during a normal mode, said input serial data obtained by said adjustment mode means.

15. An automatic gain control system for automatically controlling the gain of a video signal as defined in claim 14, wherein said adjustment mode means comprises data storage means for receiving said input serial data to generate serial data in parallel, data selection means for selecting the data stored in said data storage means upon receiving a set signal having a high logic level to generate first switching control signals, and variable voltage means for changing a reference voltage applied to one input of said amplifier according to said first switching signals.

* * * * *